US012107602B2

(12) United States Patent
Egan

(10) Patent No.: US 12,107,602 B2
(45) Date of Patent: Oct. 1, 2024

(54) DYNAMIC DECODING FOR MEMORY SYSTEMS

(71) Applicant: Micron Technology, Inc., Boise, ID (US)

(72) Inventor: Curtis W. Egan, Brighton, CO (US)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 17/833,371

(22) Filed: Jun. 6, 2022

(65) Prior Publication Data

US 2023/0396270 A1 Dec. 7, 2023

Related U.S. Application Data

(60) Provisional application No. 63/348,101, filed on Jun. 2, 2022.

(51) Int. Cl.
*H03M 13/11* (2006.01)
*G06F 3/06* (2006.01)
*G06F 11/07* (2006.01)

(52) U.S. Cl.
CPC ....... *H03M 13/1108* (2013.01); *G06F 3/0619* (2013.01); *G06F 3/064* (2013.01); *G06F 3/0679* (2013.01); *G06F 11/076* (2013.01); *H03M 13/1177* (2013.01)

(58) Field of Classification Search
CPC ...... G06F 11/076; G06F 3/0619; G06F 3/064; G06F 3/0679; G06F 3/0659; H03M 13/1108; H03M 13/1177; H03M 13/1111; H03M 13/3707; H03M 13/3715; H03M 13/3723

See application file for complete search history.

(56) References Cited

U.S. PATENT DOCUMENTS

| | | | | |
|---|---|---|---|---|
| 10,395,754 | B2* | 8/2019 | Maffeis | H03M 13/3723 |
| 11,515,897 | B2* | 11/2022 | Cho | G06F 3/0679 |
| 2008/0109703 | A1* | 5/2008 | Brandman | G06F 11/1072 |
| | | | | 714/763 |
| 2012/0151286 | A1* | 6/2012 | Li | H03M 13/2957 |
| | | | | 714/704 |
| 2015/0178149 | A1* | 6/2015 | Cai | G06F 11/108 |
| | | | | 714/766 |
| 2015/0229337 | A1* | 8/2015 | Alhussien | H03M 13/35 |
| | | | | 714/773 |
| 2015/0234706 | A1* | 8/2015 | Alrod | G11C 29/52 |
| | | | | 714/704 |
| 2017/0091028 | A1* | 3/2017 | Golan | G06F 11/1072 |
| 2017/0177236 | A1* | 6/2017 | Haratsch | G06F 3/065 |

(Continued)

*Primary Examiner* — Albert Decady
*Assistant Examiner* — Enamul M Kabir
(74) *Attorney, Agent, or Firm* — Schwegman Lundberg & Woessner, P.A.

(57) ABSTRACT

Aspects of the present disclosure configure a system component, such as memory sub-system controller, to dynamically decode read data for zone-based memory allocations. The memory sub-system controller reads an entire memory block or zone. The memory sub-system controller decodes a first portion of the memory block or zone using a first decoding process. The memory sub-system controller determines that a second portion of the memory block or zone satisfies a criterion. In response, the memory sub-system controller applies a second decoding process to decode the second portion.

20 Claims, 7 Drawing Sheets

(56) References Cited

U.S. PATENT DOCUMENTS

| | | |
|---|---|---|
| 2017/0269991 A1* | 9/2017 | Bazarsky ................ G06F 3/064 |
| 2018/0159559 A1* | 6/2018 | Bazarsky ........... H03M 13/1102 |
| 2020/0004626 A1* | 1/2020 | Pignatelli ............ G06F 11/1012 |
| 2020/0373944 A1* | 11/2020 | Cho .................... G06F 11/1048 |
| 2021/0319834 A1* | 10/2021 | Sharifi Tehrani .... G11C 7/1045 |
| 2021/0397562 A1* | 12/2021 | Bhardwaj ............... G06F 12/10 |
| 2022/0083261 A1* | 3/2022 | Fujiwara ............... G06F 3/0679 |
| 2022/0137815 A1* | 5/2022 | Nowell ................ G06F 3/0604 711/103 |
| 2023/0253985 A1* | 8/2023 | Steiner ................... G06F 11/10 714/794 |

* cited by examiner

DYNAMIC DECODING FOR MEMORY SYSTEMS

CROSS-REFERENCE TO RELATED APPLICATION

This application is a non-provisional of and claims priority to U.S. Provisional Patent Application No. 63/348,101, filed Jun. 2, 2022, which is incorporated by reference herein in its entirety.

TECHNICAL FIELD

Embodiments of the disclosure relate generally to memory sub-systems and more specifically to dynamic decoding in a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
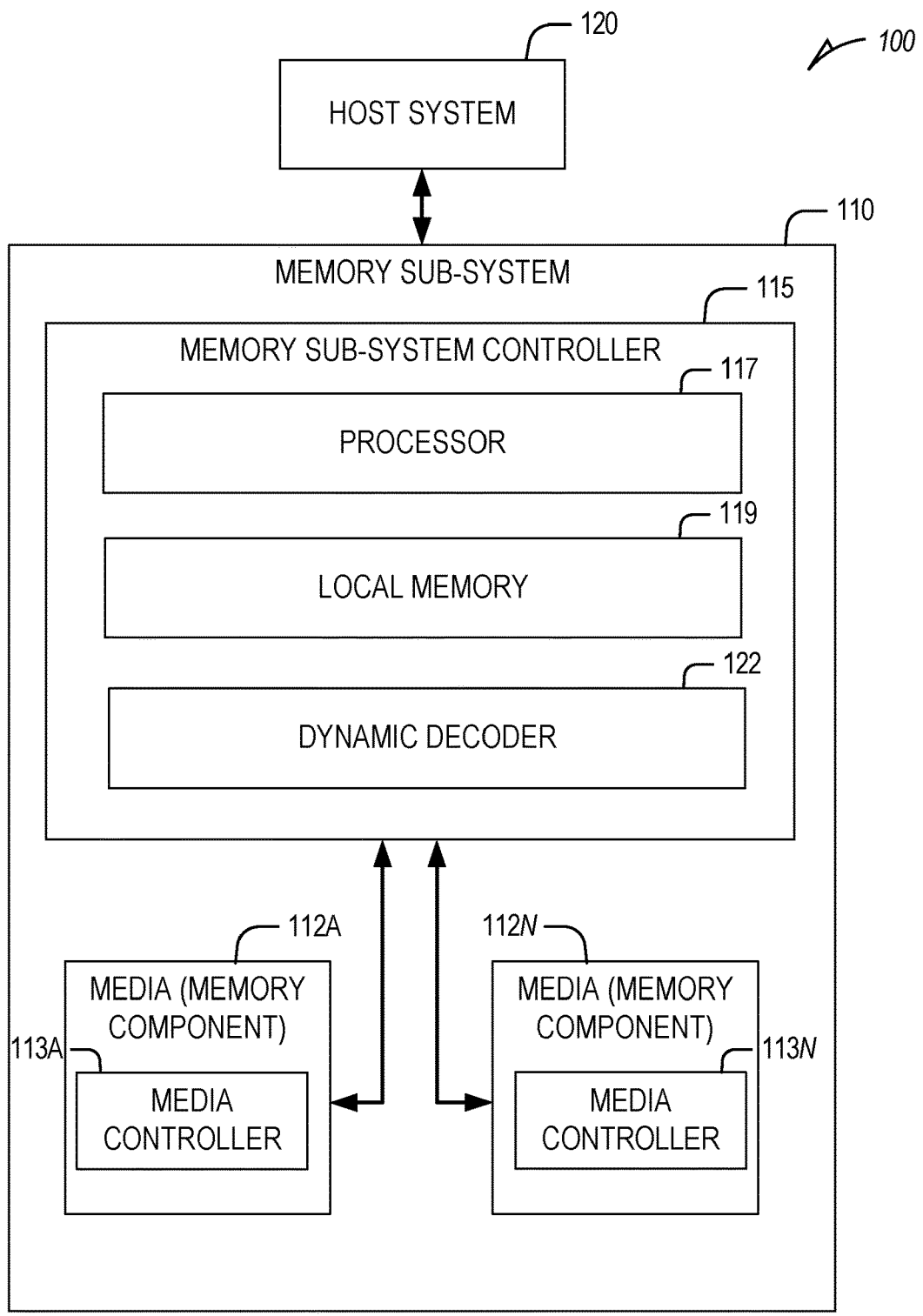
FIG. 1 is a block diagram illustrating an example computing environment including a memory sub-system, in accordance with some embodiments of the present disclosure.

Aspects of the present disclosure configure a system component, such as a memory sub-system controller, to dynamically decode data stored using zone-based memory allocations. A zone can include one logical block address (LBA) or multiple LBAs (also sometimes referred to as blocks). The decoding process used to decode data read from a given zone or LBA is selected on the basis of whether an individual portion (one or more pages) of the given zone or LBA satisfies a criterion. The criterion can represent a read bit error rate (RBER) predicted for the individual portion of the zone or LBA. The RBER can be predicted based the RBER associated with previously decoded portions of the zone or LBA and/or physical locations of the memory sub-system identified during or after manufacture as having relatively high RBER (an RBER that exceeds or transgresses a threshold).

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can send access requests (e.g., write command, read command, sequential write command, sequential read command) to the memory sub-system, such as to store data at the memory sub-system and to read data from the memory sub-system. The data specified by the host is hereinafter referred to as "host data" or "user data".

The data can be stored in the memory sub-system according to zones. Namely, various zones can be defined in the memory sub-system each of which can be uniquely associated with a particular set of user data or an application. For example, a first zone can be associated with a first application (or user data identified as received from the first application) and a second zone can be associated with a second application. Host data or user data received from the first application can be stored by the memory sub-system in the first zone. Each zone can include multiple or a plurality of LBAs which each include a plurality of pages of data.

During a sequential read or sequential write operation, the zone or LBA is read or written all at once. Specifically, a request to perform a sequential write operation in association with an individual zone or LBA can instruct the memory sub-system to erase all of the pages of the LBA or all the LBAs of the individual zone and then re-write the data using data of the received write operation. In some cases, the write request includes a request to write a set of pages of data less than all of the pages of data included in the individual LBA or zone. Even in such cases, the sequential write operation causes all of the pages of data including the set of pages and other pages to be written to the memory sub-system. Similarly, a request to perform a sequential read operation in association with an individual zone or block can instruct the memory sub-system to read or retrieve all of the pages or LBAs of the individual zone simultaneously. In some cases, the read request includes a request to read a set of pages of data less than all of the pages of data included in the individual zone. Even in such cases, the sequential read operation causes all of the pages of data including the set of pages and other pages to be read from the memory sub-system simultaneously.

A host request can include logical address information (e.g., logical block address (LBA), namespace) for the host data, which is the location the host system associates with the host data and a particular zone in which to store or access the host data. The logical address information (e.g., LBA, namespace) can be part of metadata for the host data. Metadata can also include error handling data (e.g., ECC codeword, parity code), data version (e.g., used to distinguish age of data written), valid bitmap (which LBAs or logical transfer units contain valid data), etc.

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data".

"User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

A memory device can be a non-volatile memory device. A non-volatile memory device is a package of one or more dice. Each die can comprise one or more planes. Each LBA of the memory device comprises a set of pages. Each page comprises a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package. The memory device can be divided into one or more zones where each zone is associated with a different set of host data or user data or application.

Conventional memory sub-systems can employ error-correction techniques that involve a decoding process. Such decoding processes can include application of a Low Density Parity Check (LDPC) error code check (ECC) engine to data read from the memory device. The parameters of the LDPC ECC engine can be adjusted to perform more or less complex decoding operations, such as those that utilize hard bit decoding and/or those that utilize soft-bit decoding operations. By performing such error-correction techniques, if a data member of the collection is lost (e.g., corrupted) for any reason, the LDPC ECC engine can be applied to recreate the lost data.

Typical systems apply the same decoding process to all of the pages of data that are read from an individual LBA. While such approaches generally work well for conventional memory devices, these approaches can end up wasting time and processing resources for memory pages that can be decoded with less complex decoding methodologies. Namely, applying a one-size-fits-all approach with respect to decoding methodologies ends up wasting resources. Particularly, in case of sequentially written data, such as on a Quad Level Cell (QLC) NAND block, the data that is written all at once ages at the same rate. Specifically, the slow change loss (SCL) of the block of data loses charge at the same rate. In such cases, applying the same decoding methodology across all of the pages in the same block can be wasteful.

Aspects of the present disclosure address the above and other deficiencies by configuring a system component, such as a memory sub-system controller of a memory sub-system, to dynamically modify the decoding process applied to decode data read from different portions of the same block or zone (multiple LBAs). In particular, a memory sub-system controller of some embodiments described herein can read a zone that includes one or more LBAs (e.g., pages of data) from the memory sub-system. As the pages of data are decoded, the RBER associated with decoding the pages of data is tracked. Once the RBER reaches a threshold value, the memory sub-system controller adjusts the decoding process, such as to apply a more complex set of decoding operations to decode the data. In this way, the memory sub-system controller can predict the RBER for later pages of the same block or zone and can apply a more complicated and more time-consuming decoding process to decode the data. Specifically, given that the SCL of the block of data uniformly deteriorates, so does the RBER. Based on this phenomenon, the memory sub-system controller can avoid applying a one-size-fits-all approach to decoding data. Instead, the memory sub-system controller applies a dynamic decoding process which leverages known RBER data to select the most suitable decoding operations. This avoids wasting decoding iterations and system resources by performing faster and less complex decoding operations first for a first set of pages or word lines (WLs) of data and then performing more complex and slower decoding operations for a later set of pages or WLs.

For instance, some embodiments the memory sub-system controller receives a request to read a set of user data from a zone of a plurality of zones of a memory sub-system. In response, the memory sub-system controller retrieves a plurality of pages of data stored across one or more of the zone of the plurality of zones of the memory sub-system, the set of user data being included in a portion of the plurality of zones. The memory sub-system controller applies a first decoding process to decode a first portion of data stored in a first portion of the plurality of pages and determines whether a second portion of the plurality of pages satisfies a criterion. Based on determining whether the second portion of the plurality of pages satisfies the criterion, the memory sub-system controller applies a second decoding process to decode a second portion of data stored in the second portion of the plurality of pages.

As referred to herein, the criterion controls whether one type of decoding process is used to decode a portion of data read from a zone or another type of decoding process is used to decode the portion of the data read from the zone. The criterion can include multiple criteria in some examples. The determination of whether a portion satisfies a criterion or multiple criteria can be based on one or several factors. In some examples, the criterion is satisfied if the portion is associated with a page or physical storage location that is known to have a RBER that transgresses a certain threshold. In some examples, the criterion is satisfied if the portion is immediately adjacent to or is within a threshold distance to a previous page that was decoded using a less complex decoding process and resulted in having a RBER that transgresses a certain threshold. In some examples, the criteria is satisfied if one or both criteria is met, such as a page that is retrieved from a physical storage location known to have an RBER that transgresses the threshold and/or is immediately adjacent to or is within a threshold distance to a previous page that was decoded using a less complex decoding process and resulted in having a RBER that transgresses a certain threshold. In some examples, the criterion is satisfied if the portion is associated with a page or physical storage location that is was stored and/or access more than a threshold time before and/or is associated with a temperature or temperature changes that exceed a threshold. In some examples, the criterion is satisfied if the portion is of a certain size. Satisfaction of the criterion or criteria transitions the decoding process used to decode a portion of data from a less complex decoding methodology to a more complex decoding methodology.

In some examples, the first portion of the plurality of pages include an individual page of the plurality of pages. In some examples, the first portion of the plurality of pages include an individual word line of the zone. In some cases, the first decoding process includes applying an LDPC ECC engine that uses hard-bit decoding and the second decoding process includes applying the LDPC ECC engine that uses soft-bit decoding. In some examples, the LDPC ECC engine includes 27 layers or more. The soft-bit decoding can include one hard one soft (1H1S) decoding. It may be deemed necessary to have multiple levels of soft-bit information to decode, such as (1H3S) or (1H5S).

For some embodiments, the memory sub-system controller determines whether the second portion of the plurality of pages satisfies the criterion by determining that the second portion corresponds to a top page (TP) portion of the zone that is previously known to be associated with a RBER that transgresses a threshold RBER. Specifically, one or more physical portions of the memory sub-system can be identified during or after manufacture of the memory sub-system as being associated with the RBER that transgresses the threshold RBER. The portion (LBA or pages) of the zone is physically located within the identified one or more physical portions and can be identified by accessing a table that stores an association between the one or more physical portions of the memory sub-system and their respective RBER that transgresses the threshold RBER.

For some embodiments, the memory sub-system determines a RBER associated with decoding the first portion of the data stored in the first portion of the plurality of pages. The memory sub-system compares the RBER associated with decoding the first portion of the data stored in the first portion of the plurality of pages to a threshold RBER. The memory sub-system determines whether the second portion of the plurality of pages satisfies the criterion by determining that the RBER associated with decoding the first portion of the data stored in the first portion of the plurality of pages transgresses the threshold RBER. In such cases, the memory sub-system determines that the second portion of the plurality of pages sequentially follows the first portion of the plurality of pages. In some examples, the threshold RBER includes or represents a hard bit limit of a decoding engine (e.g., an LDPC ECC engine).

For some embodiments, a memory sub-system (e.g., memory sub-system controller) receives host or user data from a host system along with a sequential write request. The memory sub-system writes the host/user data to a zone that includes a set of one or more LBAs on a set of memory components of the memory sub-system all at once or concurrently. Though various embodiments are described herein as being implemented with respect to a memory sub-system (e.g., a controller of the memory sub-system), some or all of the portions of an embodiment can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or LBAs that can refer to a unit of the memory component 112 used to store data. In some examples, the memory cells of the memory components 112A to 112N can be grouped into a set of different zones of equal or unequal size used to store data for corresponding applications. In such cases, each application can store data in an associated zone of the set of different zones.

The memory sub-system controller 115 can communicate with the memory components 112A to 112N to perform operations such as reading data, writing data, or erasing data at the memory components 112A to 112N and other such operations. The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. The memory sub-system controller 115 can be responsible for other operations such as wear leveling operations, garbage collection operations, error detection and ECC operations, decoding operations, encryption operations, caching operations, address translations between a logical block address and a physical block address that are associated with the memory components 112A to 112N, address translations between an application identifier received from the host system 120 and a corresponding zone of a set of zones of the memory components 112A to 112N. This can be used to restrict applications to reading and writing data only to/from a corresponding zone of the set of zones that is associated with the respective applications. In such cases, even though there may be free space elsewhere on the memory components 112A to 112N, a given application can only read/write data to/from the associated zone, such as by erasing data stored in the zone and writing new data to the zone. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component, to communicate with the memory sub-system controller 115, and to execute memory requests (e.g., read or write) received from the memory sub-system controller 115.

The memory sub-system 110 includes a dynamic decoder 122 that performs or facilitates decoding in accordance with some embodiments described herein. In some embodiments, the controller 115 includes at least a portion of the dynamic decoder 122. For example, the controller 115 can include a processor 117 (processing device) configured to execute instructions stored in local memory 119 for performing the operations described herein. In some embodiments, the dynamic decoder 122 is part of the host system 120, such as a software application or an operating system on the host system 120.

According to some embodiments, the memory sub-system 110 can receive, from the host system 120, a request to sequentially write data (e.g., host/user data) to a first zone (e.g., a first LBA or group of LBAs) of a set of zones of the memory components 112A to 112N. In response to the request, the memory sub-system 110 can cause the memory sub-system controller 115 to write the data to a set of LBAs that correspond to the first zone of the memory components 112A to 112N all at once. Namely, the memory sub-system 110 can cause the memory sub-system controller 115 to erase all of the LBAs associated with the first zone and then re-write the LBAs including the data received from the host system 120.

According to some embodiments, the memory sub-system 110 can receive, from the host system 120, a request to sequentially read data from the first zone or LBA. In response to this request, the memory sub-system 110 can cause the memory sub-system controller 115 to retrieve all of the pages, LBAs and/or WLs stored in the first zone. The memory sub-system 110 can cause the dynamic decoder 122 to dynamically decode the data retrieved from the first zone. In response, the dynamic decoder 122 can decode a first portion of the data (e.g., a first page or WL) in accordance with a first decoding process or methodology by applying a first decoding process to the first portion of the data. Additionally, in response to the request, the dynamic decoder 122 determines whether a second portion of the plurality of pages satisfies a criterion. The second portion can immediately follow or sequentially follow the first portion. For example, the second portion can be the second page and the first portion is the first page of the first zone.

In some cases, the dynamic decoder 122 determines whether the second portion satisfies the criterion by accessing a table that associates individual pages or physical locations with known or previously determined RBER values. In response to determining that the second portion is associated with an RBER value that is known or previously determined to exceed or transgress a threshold RBER, the dynamic decoder 122 applies a second decoding process (different from the first decoding process) to decode the data of the second portion. As an example, the second decoding process can utilize soft-bit information in an LDPC ECC engine while the first decoding process only utilizes or relies upon hard-bit information.

As another example, the dynamic decoder 122 can continuously track the RBER of each portion of data that is decoded from the retrieved first pages (or portion of data) within the first zone. The dynamic decoder 122 can, before decoding a subsequent portion of data of the first zone, access the RBER determined for the previously decoded portion. The dynamic decoder 122 can compare the RBER of the previously decoded portion to an RBER threshold. In response to determining that the RBER of the previously decoded portion transgresses the RBER threshold, the dynamic decoder 122 selects and applies a more complex or time-consuming decoding process to decode the subsequent portion of the data of the first zone.

Depending on the embodiment, the tracking data can be saved in reserved memory space of the memory sub-system 110, which can be provided by the memory components 112A to 112N or the local memory 119. The tracking data can comprise a data structure that can implement zone or LBA identification information that indicate which zones or LBAs (adjacent or non-adjacent) are associated with particular parity data currently stored in the temporary storage location. The tracking data can also include in the data structure information indicating a last time since the parity data has been updated (e.g., as a result of another zone being determined to meet a corresponding zone completeness criterion). For example, the dynamic decoder 122 can determine that the RBER resulting from decoding the first portion of the first zone is a value, such as 160 bits in error, which exceeds the RBER threshold of 150 bits in error. In such cases, the dynamic decoder 122 applies a soft-bit decoding methodology or process in the LDPC ECC engine while decoding the subsequent second portion of the data of the first zone or LBA. Utilizing soft-bit decoding can enable the LDPC ECC engine to identify and correct a greater quantity of bit errors than only utilizing hard-bit decoding. However, soft-bit decoding can consume a greater amount of resources than hard-bit decoding and can take longer to perform the decoding operations.

Depending on the embodiment, the dynamic decoder 122 can comprise logic (e.g., a set of transitory or non-transitory machine instructions, such as firmware) or one or more components that causes the memory sub-system 110 (e.g., the memory sub-system controller 115) to perform operations described herein with respect to the dynamic decoder 122. The dynamic decoder 122 can comprise a tangible or non-tangible unit capable of performing operations described herein. Further details with regards to the operations of the dynamic decoder 122 are described below.

Figure 2:
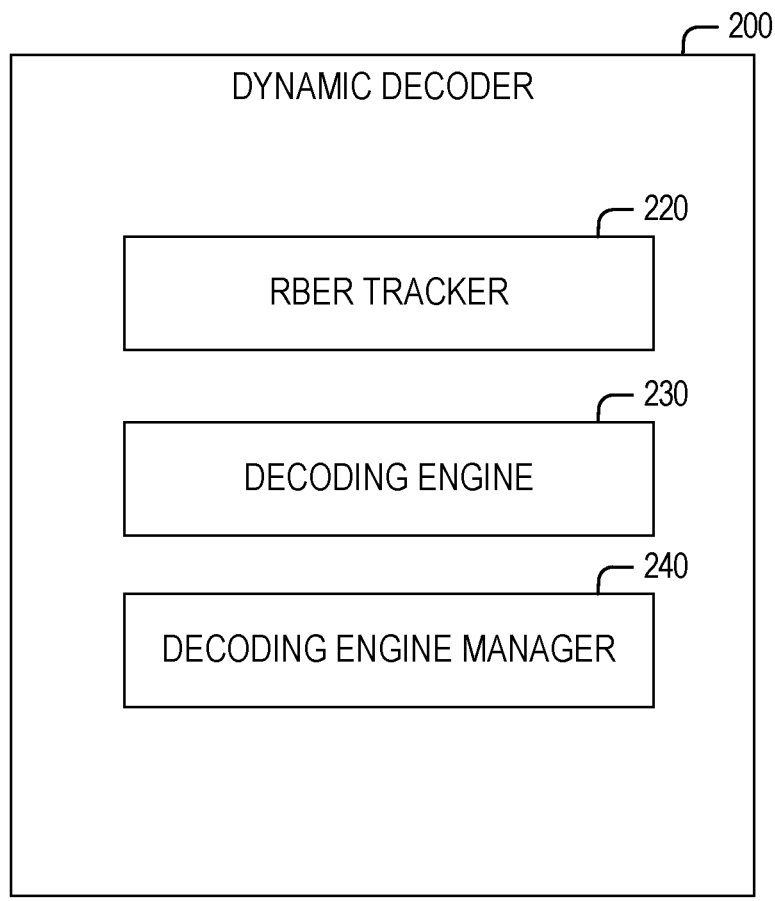
FIG. 2 is a block diagram of an example dynamic decoder, in accordance with some implementations of the present disclosure.

FIG. 2 is a block diagram of an example dynamic decoder 200, in accordance with some implementations of the present disclosure. As illustrated, the dynamic decoder 200 includes an RBER tracker 220, a decoding engine 230, and a decoding engine manager 240. For some embodiments, the dynamic decoder 200 can differ in components or arrangement (e.g., less or more components) from what is illustrated in FIG. 2.

The dynamic decoder 200 enables or facilitates dynamically decoding user data read from one or more zones including respective LBAs of the set of memory components 112. The decoding engine 230 implements multiple types of decoding processes. For example, the decoding engine 230 can implement a first decoding process that includes an LDPC ECC engine that utilizes hard-bit decoding operations. The decoding engine 230 can implement a second decoding process that includes an LDPC ECC engine that utilizes soft-bit decoding operations. The second decoding process can, in some cases, utilize both hard-bit and soft-bit decoding operations.

The RBER tracker 220 enables or facilitates updates to tracking RBER values of portions of a zone that are decoded. For instance, the RBER tracker 220 can receive data from the decoding engine 230 that indicates the RBER resulting from decoding a first portion (e.g., a page or WL) of the zone read from the set of memory components 112. Namely, after or during decoding of the first portion of data by the decoding engine 230, such as by applying a first decoding process to the first portion of the data, the decoding engine 230 can generate an RBER value. The RBER value is transmitted to the RBER tracker 220. The RBER tracker 220 stores the RBER value in association with the first portion.

In some examples, the RBER tracker 220 stores in a table an association between one or more physical memory LBAs, pages, WLs or locations of the set of memory components 112 and known RBER values. The known RBER values can be identified during or after manufacture of the memory device and can be predetermined before the zone is read or retrieved from the set of memory components 112.

The decoding engine manager 240 accesses a second portion of the zone read from the set of memory components 112. The decoding engine manager 240 accesses the table stored by the RBER tracker 220. The decoding engine manager 240 can search the table to determine whether the second portion is stored in a physical location that is specified in the table. In response to identifying the physical location of the second portion in the table, the decoding engine manager 240 retrieves the previously known or determined RBER value of the second portion. The decoding engine manager 240 compares the RBER value to an RBER threshold. In response to determining that the RBER value transgresses or exceeds the RBER threshold, the decoding engine manager 240 instructs the decoding engine 230 to apply the second decoding process to decode the second portion. In this way, a less complex decoding process can be used to decode a first group of portions of the zone read from the set of memory components 112 and a more complex decoding process can be used to decode a second group of portions of the zone read from the set of memory components 112. The second group of portions can be stored in subsequent locations relative to the first group of portions.

In some examples, the decoding engine manager 240 accesses the second portion of the zone read from the set of memory components 112. The decoding engine manager 240 accesses the RBER value stored for the immediate previously decoded portion from the RBER tracker 220. Namely, the decoding engine manager 240 can determine the page value (e.g., page 2) of the second portion and can request the RBER tracker 220 to provide the RBER value stored for the previous page value (e.g., page 1). The decoding engine manager 240 compares the RBER value of the previous portion to an RBER threshold. In response to determining that the RBER value transgresses or exceeds the RBER threshold, the decoding engine manager 240 instructs the decoding engine 230 to apply the second decoding process to decode the second portion. In this way, a less complex decoding process can be used to decode a first group of portions of the zone read from the set of memory components 112 and a more complex decoding process can be used to decode a second group of portions of the zone read from the set of memory components 112. The second group of portions can be stored in subsequent locations relative to the first group of portions.

Figure 3:
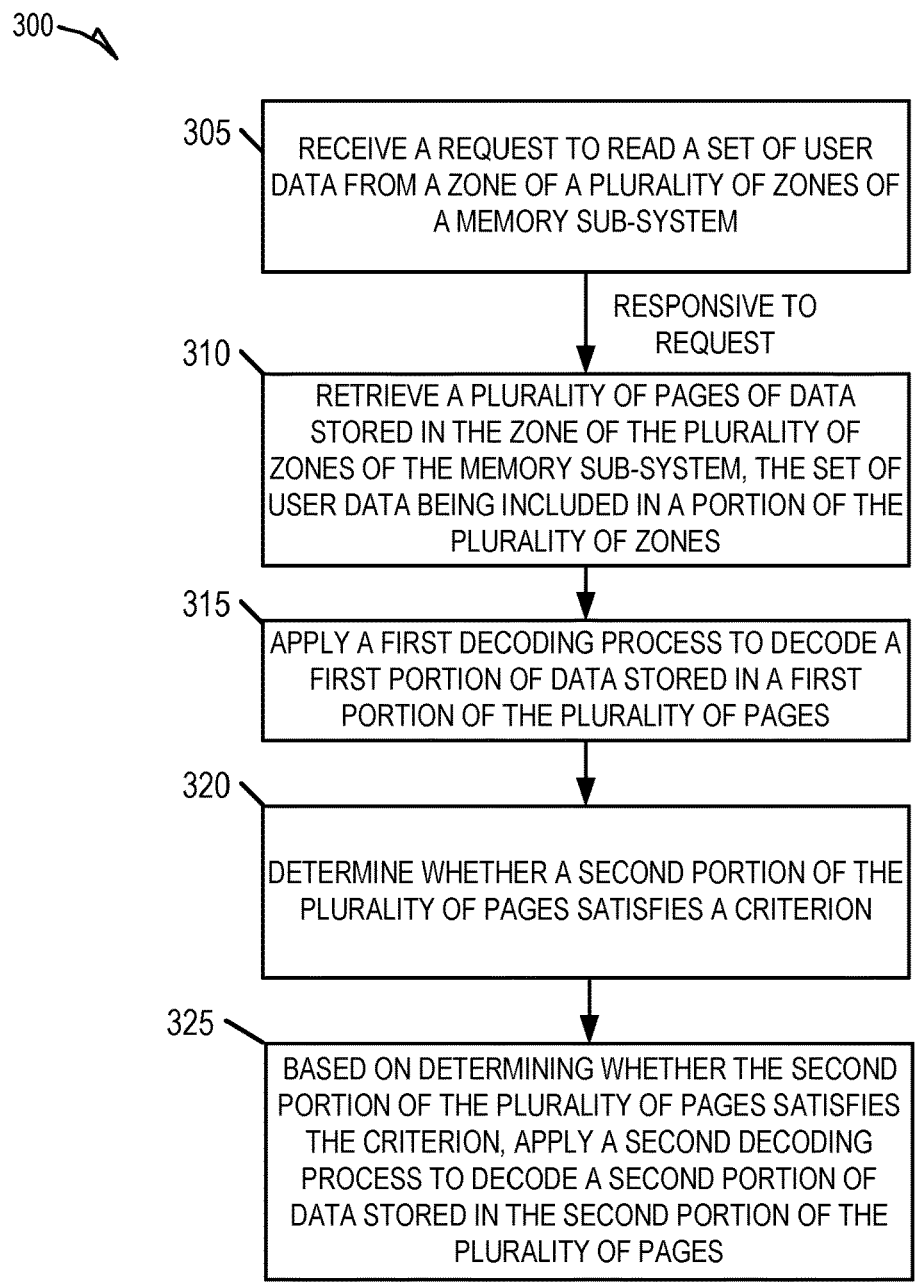
FIG. 3 is a flow diagram of an example method to perform dynamic decoding, in accordance with some implementations of the present disclosure.

FIG. 3 is a flow diagram of an example method 300 to perform zone-based decoding, in accordance with some implementations of the present disclosure. Method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by the memory sub-system controller 115 of FIG. 1. In these embodiments, the method 300 can be performed, at least in part, by the dynamic decoder 122. Although the processes are shown in a particular sequence or order, unless otherwise specified, the order of the processes can be modified. Thus, the illustrated embodiments should be understood only as examples; the illustrated processes can be performed in a different order, and some processes can be performed in parallel. Additionally, one or more processes can be omitted in various embodiments. Thus, not all processes are required in every embodiment. Other process flows are possible.

Referring now FIG. 3, the method (or process) 300 begins at operation 305, with a processing device of a memory sub-system (e.g., of processor of the memory sub-system controller 115) receiving a request to read a set of user data from a zone of a plurality of zones of a memory sub-system (e.g., the memory components 112A to 112N) of the memory sub-system. For some embodiments, the request is from a host system (e.g., the host system 120) communicatively coupled to the memory sub-system.

At operation 310, the processing device of the memory sub-system, in response to receiving the request at operation 305, retrieves a plurality of pages of data stored in the zone of the plurality of zones of the memory sub-system, the set of user data being included in a portion of the plurality of zones. Thereafter, at operation 315, the processing device of the memory sub-system applies a first decoding process to decode a first portion of data stored in a first portion of the plurality of pages.

The processing device of the memory sub-system, at operation 320, determines whether a second portion of the plurality of pages satisfies a criterion. Then, the processing device of the memory sub-system, at operation 325, based on determining whether the second portion of the plurality of pages satisfies the criterion, applies a second decoding process to decode a second portion of data stored in the second portion of the plurality of pages.

Figure 4:
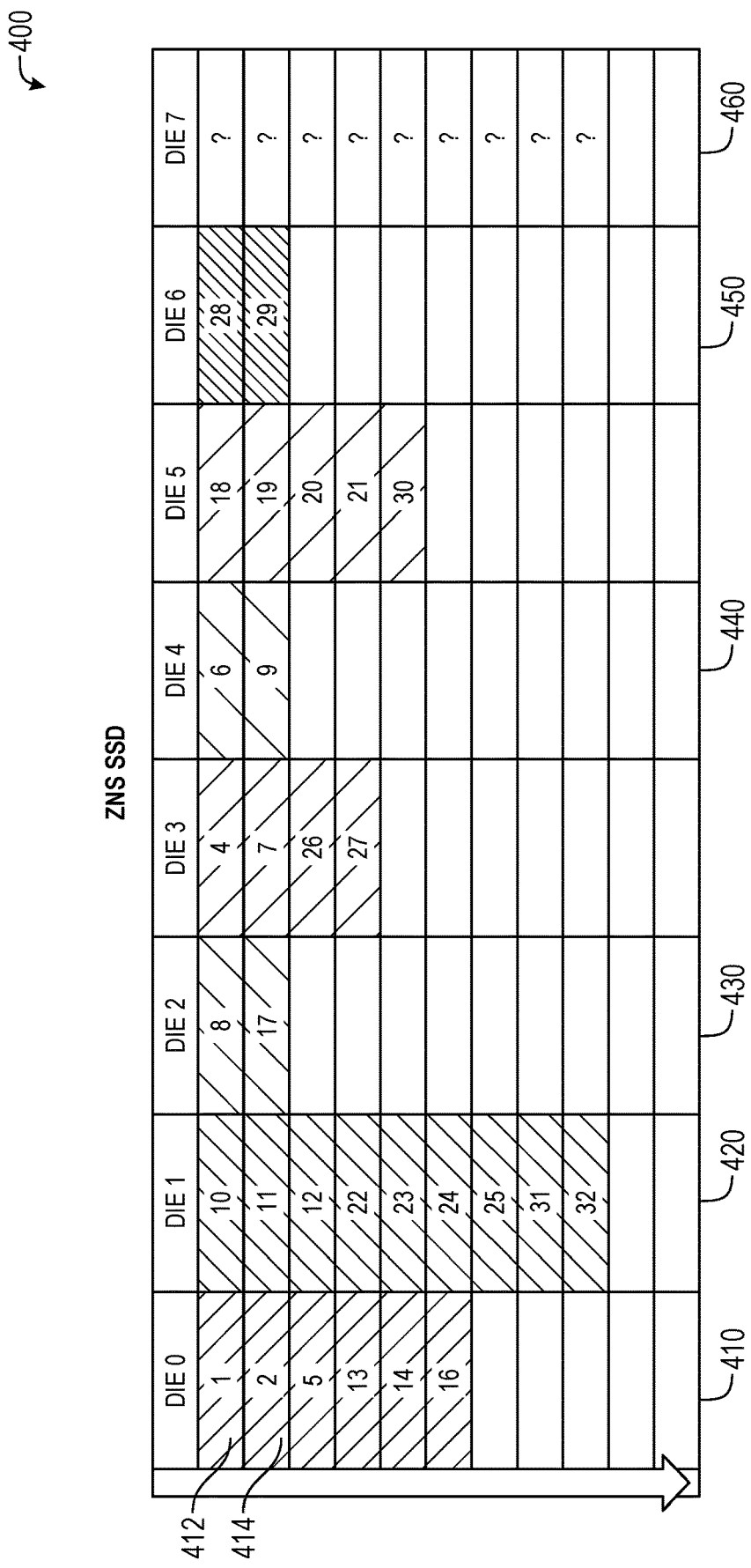
FIG. 4 presents a table illustrating an example set of zones used to store user data to perform dynamic decoding, in accordance with some implementations of the present disclosure.

FIG. 4 presents a table 400 that illustrates an example of an error-correction protection technique (more specifically, an LDPC ECC technique) that bases error correction parity generation and storage on dedicated data zones of a set of memory components, in accordance with some embodiments. As shown by the table 400, the example technique is implemented by seven NAND die (Die 0 through 7), where each die has a set of blocks or planes. For some embodiments, the die are implemented using SLC NAND devices with multiplane support. The data chunk size for each memory page 0 through 6 on each plane can comprise 16 KB. The different shading patterns shown in the drawing represent different zones associated with different applications.

In some cases, a first zone 410 can correspond to a first size (e.g., a maximum size of Die 0) and includes a first data block 412 and a second data block 414. Each data block can include a respective set of pages of data. A second zone 420 can correspond to a second size and can be configured to store data on all of the blocks of Die 1; a third zone 430 can be configured to store data on all of the blocks of Die 2; a fourth zone 440 can be configured to store data on all of the blocks of Die 4 or on some specified fraction of Die 4; a fifth zone 450 can be configured to store data on all of the blocks of Die 6 or on some specified fraction of Die 6; and a parity storage location 460 can be configured to permanently store data on Die 7.

In some embodiments, the dynamic decoder 200 reads or retrieves data stored in the first zone 410 in response to a sequential read operation. In such cases, the entire portion of the first zone 410 is retrieved all at once. Namely, the first data block 412 and the second data block 414 of the first zone 410 are both retrieved along with other data blocks that are part of or associated with the first zone 410. The dynamic decoder 200 begins decoding the first zone 410 by applying a first decoding process (e.g., an LDCP ECC engine that utilizes only hard-bit decoding operations) to the first data block 412 (e.g., a first page of data).

The dynamic decoder 200 determines whether the second data block 414 (e.g., a second page of data) satisfies a criterion. For example, the dynamic decoder 200 determines whether the RBER known to be associated with the storage location of the second data LBA 414 exceeds or transgresses an RBER threshold. In such cases, the dynamic decoder 200 applies a second decoding process to decode the data stored in the second data LBA 414. As another example, the dynamic decoder 200 determines whether the RBER value that results from decoding the first data block 412 exceeds or transgresses the RBER threshold. In such cases, the dynamic decoder 200 applies a second decoding process (e.g., an LDCP ECC engine that utilizes soft-bit decoding operations) to decode the data stored in the second data LBA 414.

Figure 5:
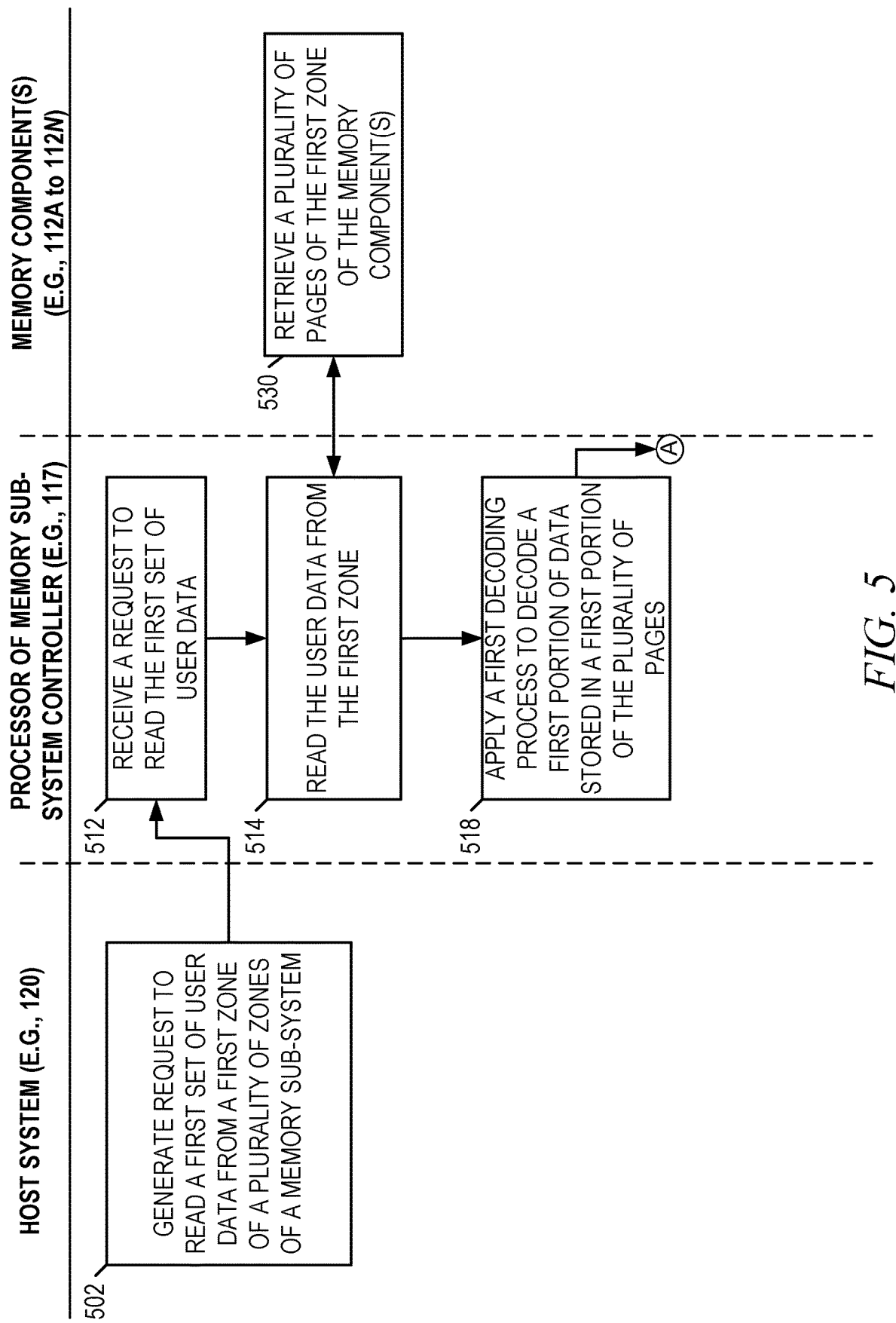
FIGS. 5 and 6 provide an interaction diagram illustrating interactions between components of the computing environment in the context of some embodiments in which a method performs dynamic decoding.
Figure 6:
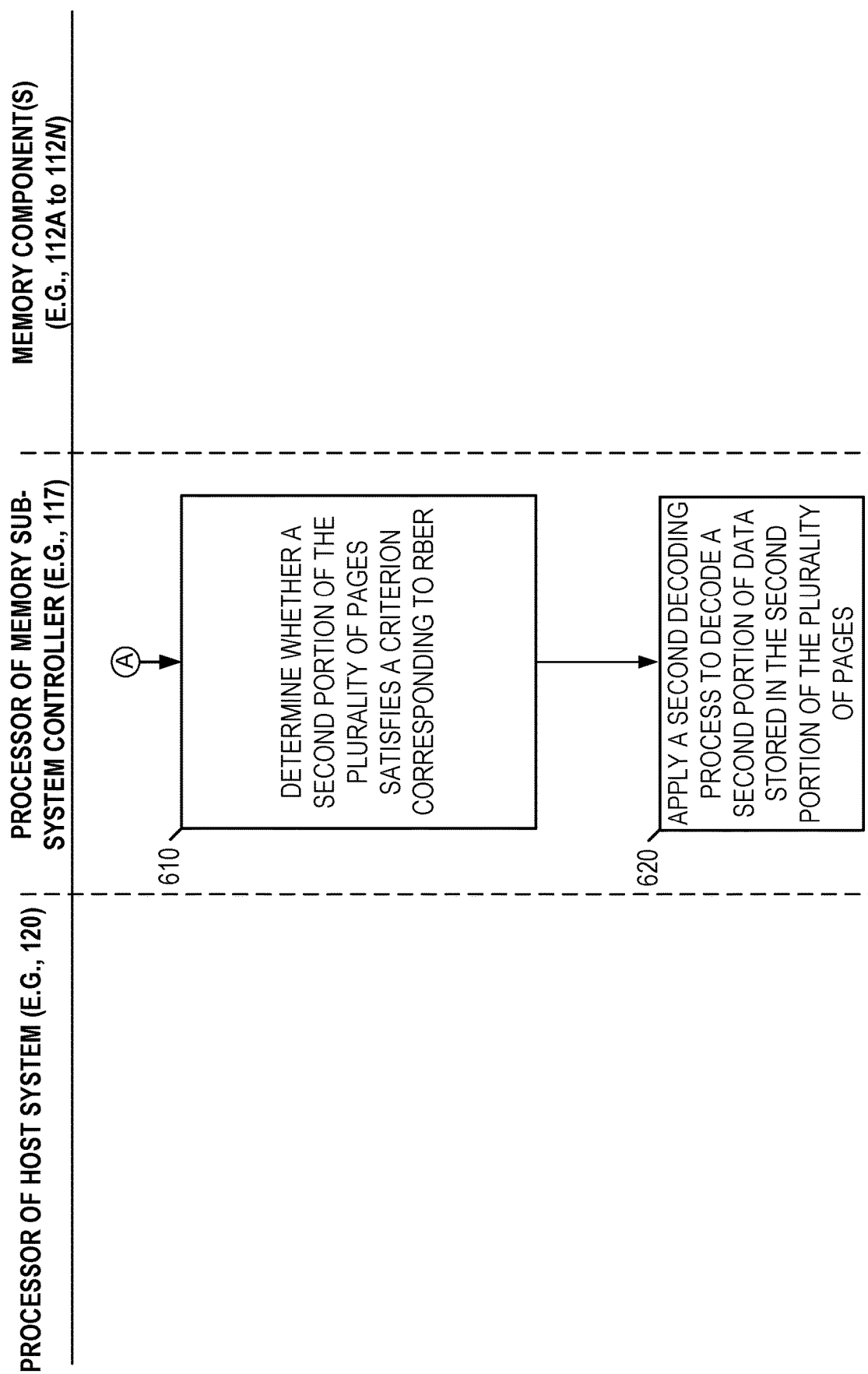

FIGS. 5 and 6 provide an interaction diagram illustrating interactions between components of the computing environment 100 in the context of some embodiments in which a method (or process) performs zone-based decoding. The operations of the method can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method is performed by the memory sub-system controller 115. Although the operations are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment.

In the context of the example illustrated in FIGS. 5 and 6, the host system can comprise the host system 120, the processor of the memory sub-system controller can comprise the processor 117 of the memory sub-system 110, and the one or more memory components can comprise at least one of the memory components 112A to 112N.

As shown in FIG. 5, at operation 502, the host system (e.g., via a processor of the host system 120) generates a request to read a first set of user data from a first zone of a plurality of zones of the memory sub-system and, at operation 512, the processor of the memory sub-system controller receives the request from the host system.

At operation 514, the processor of the memory sub-system controller reads, accesses, or retrieves the user data from a set of blocks of the first zone of a set of memory components (e.g., the memory components 112A to 112N). At operation 530, the set of memory components of the first zone provide a plurality of pages of data from the first zone all at once to the processor.

At operation 518, the processor of the memory sub-system controller applies a first decoding process to decode the first portion of the data stored in the first portion of the plurality of pages (e.g., data stored in an individual page or WL or multiple pages or WLs).

Referring now to FIG. 6, at operation 610 the processor of the memory sub-system controller determines whether a second portion of the plurality of pages satisfies a criterion corresponding to RBER. Based on this determination, the processor, at operation 620, applies a second decoding process to decode the second portion of the data stored in the second portion of the plurality of pages.

In view of the disclosure above, various examples are set forth below. It should be noted that one or more features of an example, taken in isolation or combination, should be considered within the disclosure of this application.

Example 1: a system comprising: a set of memory components; and a processing device, operatively coupled to the set of memory components, configured to perform operations comprising: receiving a request to read a set of user data from a zone of a plurality of zones of a memory sub-system; and in response to the request: retrieving a plurality of pages of data stored in the zone of the plurality of zones of the memory sub-system, the set of user data being included in a portion of the plurality of zones; applying a first decoding process to decode a first portion of data stored in a first portion of the plurality of pages; determining whether a second portion of the plurality of pages satisfies a criterion; and based on determining whether the second portion of the plurality of pages satisfies the criterion, applying a second decoding process to decode a second portion of data stored in the second portion of the plurality of pages.

Example 2, the system of Example 1 wherein the first portion of the plurality of pages comprises an individual page of the plurality of pages.

Example 3, the system of Example 1 or 2 wherein the first portion of the plurality of pages comprises an individual word line of the zone.

Example 4, the system of any one of Examples 1-3, wherein determining whether the second portion of the plurality of pages satisfies the criterion comprises: determining that the second portion corresponds to a top page (TP) portion of the zone that is previously known to be associated with a read bit error rate (RBER) that transgresses a threshold RBER.

Example 5, the system of Example 4, the operations comprising identifying one or more physical portions of the memory sub-system during manufacture of the memory sub-system that are associated with the RBER that transgresses the threshold RBER, the portion of the zone is physically located within the identified one or more physical portions.

Example 6, the system of any one of Examples 1-5, wherein the request comprises a sequential read operation that causes an entire block of data or entire zone of data to be read.

Example 7, the system of any one of Examples 1-6, wherein the zone comprises a plurality of memory blocks.

Example 8, the system of any one of Examples 1-7, the operations comprising: determining a read bit error rate (RBER) associated with decoding the first portion of the data stored in the first portion of the plurality of pages; and comparing the RBER associated with decoding the first portion of the data stored in the first portion of the plurality of pages to a threshold RBER.

Example 9, the system of Example 8, wherein determining whether the second portion of the plurality of pages satisfies the criterion comprises: determining that the RBER associated with decoding the first portion of the data stored in the first portion of the plurality of pages transgresses the threshold RBER; and determining that the second portion of the plurality of pages sequentially follows the first portion of the plurality of pages.

Example 10, the system of Example 9, wherein the threshold RBER comprises a hard bit limit of a decoding engine.

Example 11, the system of any one of Examples 1-10, wherein the first decoding process comprises applying an Low Density Parity Check (LDPC) error code check (ECC) engine that uses hard bit decoding.

Example 12, the system of Example 11, wherein the second decoding process comprises applying the LDPC ECC engine that uses soft-bit decoding.

Example 13, the system of Example 12, wherein the soft-bit decoding comprises one hard one soft (1H1S) decoding, or greater soft bit decoding.

Example 14, the system of any one of Examples 11-14, wherein the LDPC ECC engine comprises 27 layers.

Example 15, the system of any one of Examples 1-14, the operations comprising: receiving a request to write an individual portion of data; selecting the zone of the plurality of zones in which to write the individual portion of data; and writing the zone comprising the individual portion of data all at once to the memory sub-system.

Example 16, the system of any one of Examples 1-15, wherein the plurality of pages age at a same rate, and wherein a slow change loss (SCL) of the plurality of pages of data stored in the zone loses charge at the same rate.

Methods and computer-readable storage medium with instructions for performing any one of the above Examples.

Figure 7:
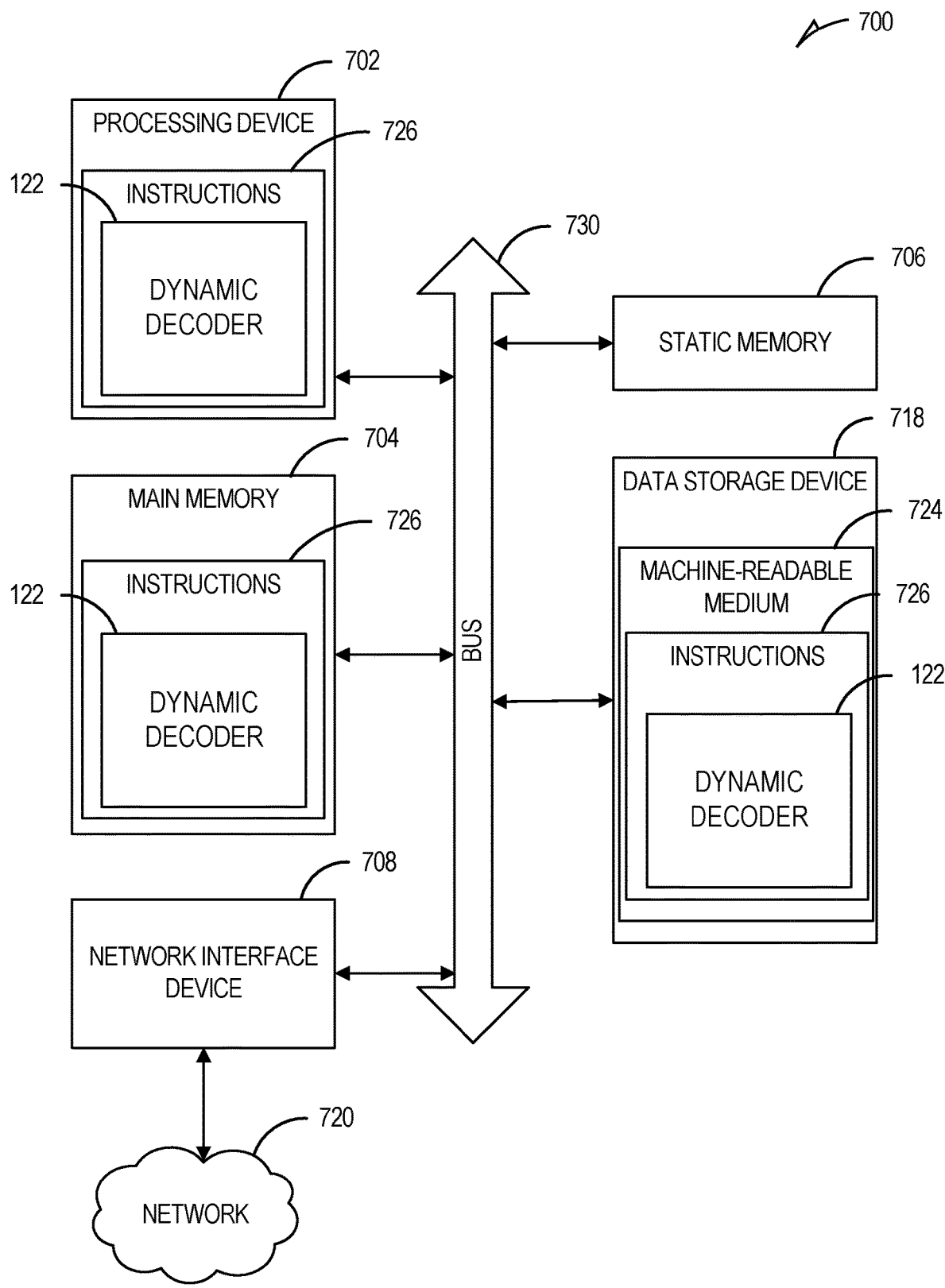
FIG. 7 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 7 illustrates an example machine in the form of a computer system 700 within which a set of instructions can be executed for causing the machine to perform any one or more of the methodologies discussed herein. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the dynamic decoder 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

The processing device 702 represents one or more general-purpose processing devices such as a microprocessor, a central processing unit, or the like. More particularly, the processing device 702 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), a network processor, or the like. The processing device 702 is configured to execute instructions 726 for performing the operations and steps discussed herein. The computer system 700 can further include a network interface device 708 to communicate over a network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to zone-based decoding (e.g., the dynamic decoder 122 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the embodiments of the disclosure as set forth in the following claims. The specification and drawings are, accordingly, to be regarded in an illustrative sense rather than a restrictive sense.

What is claimed is:

1. A system comprising:
a set of memory components; and
a processing device, operatively coupled to the set of memory components, configured to perform operations comprising:
receiving a request to read a set of user data from a zone of a plurality of zones of a memory sub-system; and
in response to the request:
retrieving a plurality of pages of data stored in the zone of the plurality of zones of the memory sub-system, the set of user data being included in a portion of the plurality of zones;
applying a first decoding process to decode a first portion of data stored in a first portion of the plurality of pages, an error rate value being generated as a result of applying the first decoding process to decode the first portion of the data;
storing, in a table, the error rate value that results from applying the first decoding process to decode the first portion of the data in association with a portion of the zone of the plurality of zones, the table storing associations between different physical portions of the set of memory components and respective error rate values that result from applying the first decoding process to data stored in the different physical portions;
accessing known error rate information that was generated prior to receiving the request to read the set of user data, the known error rate information comprising the stored error rate value that results from applying the first decoding process to decode the first portion of the data;
determining whether a second portion of the plurality of pages satisfies a criterion by searching the known error rate information that was generated prior to receiving the request to read the set of user data; and
based on determining whether the second portion of the plurality of pages satisfies the criterion, applying a second decoding process to decode a second portion of data stored in the second portion of the plurality of pages.

2. The system of claim 1, wherein the table stores tracking information indicating a last time since the error rate value stored in association with the portion of the zone has been updated.

3. The system of claim 1, the operations comprising updating an entry comprising the error rate value in the table corresponding to the portion of the zone in response to applying the first decoding process to decode the first portion of the data.

4. The system of claim 1, wherein determining whether the second portion of the plurality of pages satisfies the criterion comprises:

determining that the second portion is within a threshold distance of the first portion.

5. The system of claim 4, the operations comprising identifying one or more physical portions of the memory sub-system during manufacture of the memory sub-system that are associated with a read bit error rate (RBER) that transgresses a threshold RBER, the portion of the zone being physically located within the identified one or more physical portions.

6. The system of claim 1, wherein the request comprises a sequential read operation that causes an entire block of data or entire zone of data to be read.

7. The system of claim 1, wherein the zone comprises a plurality of memory blocks.

8. The system of claim 1, the operations comprising:
determining a read bit error rate (RBER) associated with decoding the first portion of the data stored in the first portion of the plurality of pages; and
comparing the RBER associated with decoding the first portion of the data stored in the first portion of the plurality of pages to a threshold RBER.

9. The system of claim 8, wherein determining whether the second portion of the plurality of pages satisfies the criterion comprises:
determining that the RBER associated with decoding the first portion of the data stored in the first portion of the plurality of pages transgresses the threshold RBER; and
determining that the second portion of the plurality of pages sequentially follows the first portion of the plurality of pages.

10. The system of claim 9, wherein the threshold RBER comprises a hard bit limit of a decoding engine.

11. The system of claim 1, wherein the first decoding process comprises applying a Low Density Parity Check (LDPC) error code check (ECC) engine that uses hard bit decoding.

12. The system of claim 11, wherein the second decoding process comprises applying the LDPC ECC engine that uses soft-bit decoding.

13. The system of claim 12, wherein the soft-bit decoding comprises one hard one soft (1H1S) decoding.

14. The system of claim 11, wherein the LDPC ECC engine comprises 27 layers.

15. The system of claim 1, the operations comprising:
receiving a request to write an individual portion of data;
selecting the zone of the plurality of zones in which to write the individual portion of data; and
writing the zone comprising the individual portion of data all at once to the memory sub-system.

16. The system of claim 1, wherein the plurality of pages age at a same rate, and wherein a slow change loss (SCL) of the plurality of pages of data stored in the zone loses charge at the same rate.

17. A method comprising:
receiving a request to read a set of user data from a zone of a plurality of zones of a memory sub-system; and
in response to the request:
retrieving a plurality of pages of data stored in the zone of the plurality of zones of the memory sub-system, the set of user data being included in a portion of the plurality of zones;
applying a first decoding process to decode a first portion of data stored in a first portion of the plurality of pages, an error rate value being generated as a result of applying the first decoding process to decode the first portion of the data;

storing, in a table, the error rate value that results from applying the first decoding process to decode the first portion of the data in association with a portion of the zone of the plurality of zones, the table storing associations between different physical portions of a set of memory components and respective error rate values that result from applying the first decoding process to data stored in the different physical portions;

accessing known error rate information that was generated prior to receiving the request to read the set of user data, the known error rate information comprising the stored error rate value that results from applying the first decoding process to decode the first portion of the data;

determining whether a second portion of the plurality of pages satisfies a criterion by searching the known error rate information that was generated prior to receiving the request to read the set of user data; and based on determining whether the second portion of the plurality of pages satisfies the criterion, applying a second decoding process to decode a second portion of data stored in the second portion of the plurality of pages.

18. The method of claim 17, comprising:

storing, prior to receiving the request to read the set of user data, the table;

searching the table to determine whether the second portion is stored in a physical memory location; and in response to determine that the second portion is stored in the physical memory location that is associated with an individual error rate value that transgresses a threshold, causing the second decoding process to be applied to decode the second portion of the data stored in the second portion.

19. The method of claim 17, wherein the first portion of the plurality of pages comprises an individual word line of the zone.

20. A non-transitory computer-readable storage medium comprising instructions that, when executed by a processing device, cause the processing device to perform operations comprising:

receiving a request to read a set of user data from a zone of a plurality of zones of a memory sub-system; and in response to the request:

retrieving a plurality of pages of data stored in the zone of the plurality of zones of the memory sub-system, the set of user data being included in a portion of the plurality of zones;

applying a first decoding process to decode a first portion of data stored in a first portion of the plurality of pages, an error rate value being generated as a result of applying the first decoding process to decode the first portion of the data;

storing, in a table, the error rate value that results from applying the first decoding process to decode the first portion of the data in association with a portion of the zone of the plurality of zones, the table storing associations between different physical portions of a set of memory components and respective error rate values that result from applying the first decoding process to data stored in the different physical portions;

accessing known error rate information that was generated prior to receiving the request to read the set of user data, the known error rate information comprising the stored error rate value that results from applying the first decoding process to decode the first portion of the data;

determining whether a second portion of the plurality of pages satisfies a criterion by searching the known error rate information that was generated prior to receiving the request to read the set of user data; and based on determining whether the second portion of the plurality of pages satisfies the criterion, applying a second decoding process to decode a second portion of data stored in the second portion of the plurality of pages.

* * * * *